(12) United States Patent
Stave et al.

(10) Patent No.: US 11,948,661 B2
(45) Date of Patent: Apr. 2, 2024

(54) METHODS FOR TUNING COMMAND/ADDRESS BUS TIMING AND MEMORY DEVICES AND MEMORY SYSTEMS USING THE SAME

(71) Applicant: Micron Technology, Inc., Boise, ID (US)

(72) Inventors: Eric J. Stave, Meridian, ID (US); Dirgha Khatri, Boise, ID (US); Elancheren Durai, Boise, ID (US); Quincy R. Holton, Kuna, ID (US); Timothy M. Hollis, Meridian, ID (US); Matthew B. Leslie, Boise, ID (US); Baekkyu Choi, San Jose, CA (US); Boe L Holbrook, Boise, ID (US); Yogesh Sharma, Boise, ID (US); Scott R. Cyr, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 53 days.

(21) Appl. No.: 17/244,942

(22) Filed: Apr. 29, 2021

(65) Prior Publication Data

US 2021/0383849 A1 Dec. 9, 2021

Related U.S. Application Data

(60) Provisional application No. 63/035,351, filed on Jun. 5, 2020.

(51) Int. Cl.
*G11C 8/18* (2006.01)
*G11C 7/10* (2006.01)
(Continued)

(52) U.S. Cl.
CPC .............. *G11C 8/18* (2013.01); *G11C 7/1096* (2013.01); *G11C 8/06* (2013.01); *G11C 8/12* (2013.01)

(58) Field of Classification Search
CPC ........... G11C 8/18; G11C 7/1096; G11C 8/06; G11C 8/12; G11C 5/063; G11C 29/023; G11C 29/028; G11C 2207/2254
See application file for complete search history.

(56) References Cited

U.S. PATENT DOCUMENTS 8,472,278 B2 * 6/2013 Haass ...................... G06F 1/08
                                                    365/233.1
10,147,712 B1   12/2018 Lendvay
(Continued)

FOREIGN PATENT DOCUMENTS

CN    110663035 A    1/2020
CN    111164692 A    5/2020

OTHER PUBLICATIONS

CN Patent Application No. 202110598034.5—Chinese Office Action and Search Report, dated Dec. 4, 2023, with English Translation, 10 pages.

*Primary Examiner* — Khamdan N. Alrobaie
(74) *Attorney, Agent, or Firm* — Perkins Coie LLP (57) ABSTRACT

Memory devices, systems including memory devices, and methods of operating memory devices are described, in which clock trees can be separately optimized to provide a coarse alignment between a clock signal and a command/address signal (and/or a chip select signal or other control signal), and/or in which individual memory devices can be isolated for fine-tuning of device-specific alignment between a clock signal and a command/address signal (and/or a chip select signal or other control signal). Moreover, individual memory devices can be isolated for fine- (Continued)

tuning of device-specific equalization of a command/address signal (and/or a chip select signal or other control signal).

45 Claims, 5 Drawing Sheets

(51) Int. Cl.
  *G11C 8/06* (2006.01)
  *G11C 8/12* (2006.01)

(56) References Cited

U.S. PATENT DOCUMENTS

| | | |
|---|---|---|
| 10,339,075 B2 | 7/2019 | Greeff et al. |
| 10,437,514 B2 | 10/2019 | Kim et al. |
| 2004/0006664 A1* | 1/2004 | Helzer .................... G11C 8/18 |
| | | 711/5 |
| 2005/0102568 A1* | 5/2005 | Billick .................. G06F 11/267 |
| | | 714/25 |
| 2009/0016120 A1* | 1/2009 | Kinoshita ........... G11C 11/4076 |
| | | 365/189.05 |
| 2018/0181504 A1* | 6/2018 | Morris ................ G11C 11/4093 |
| 2019/0139620 A1* | 5/2019 | Lee .................. G11C 29/50008 |
| 2021/0287730 A1* | 9/2021 | Berke ................. H02M 3/1586 |

* cited by examiner

METHODS FOR TUNING COMMAND/ADDRESS BUS TIMING AND MEMORY DEVICES AND MEMORY SYSTEMS USING THE SAME

CROSS-REFERENCE TO RELATED APPLICATION(S)

The present application claims priority to U.S. Provisional Patent Application No. 63/035,351, filed Jun. 5, 2020, the disclosure of which is incorporated herein by reference in its entirety.

TECHNICAL FIELD

The present disclosure generally relates to methods for tuning command/address bus timing and memory devices and memory systems using the same.

BACKGROUND

Memory devices are widely used to store information related to various electronic devices such as computers, wireless communication devices, cameras, digital displays, and the like. Information is stored by programing different states of a memory cell. Various types of memory devices exist, including magnetic hard disks, random access memory (RAM), read only memory (ROM), static RAM (SRAM), dynamic RAM (DRAM), synchronous dynamic RAM (SDRAM), and others. Memory devices may be volatile or non-volatile. Improving memory devices, generally, may include increasing memory cell density, increasing read/write speeds or otherwise reducing operational latency, increasing reliability, increasing data retention, reducing power consumption, or reducing manufacturing costs, among other metrics.

DETAILED DESCRIPTION

One approach to dual in-line memory module (DIMM) design seeks proper clock alignment (e.g., between a clock signal and a command/address signal) by carefully configuring factors such as board routing, package parasitic, and memory device capacitance during fabrication of a DIMM. However, variation between device performance, manufacturing tolerances and other factors may still cause clock skewing to remain, potentially causing memory reading and/or writing inaccuracies.

Accordingly, several embodiments of the present technology are directed to memory devices, systems including memory devices, and methods of operating memory devices in which clock trees can be separately optimized to provide a coarse alignment (e.g., averaged across multiple memory devices) between a clock signal and a command/address signal (and/or a chip select signal), and in which individual memory devices can be isolated for fine-tuning of device-specific alignment between a clock signal and a command/address signal (and/or a chip select signal), as well as device-specific equalization of a command/address signal (and/or a chip select signal).

Figure 1:
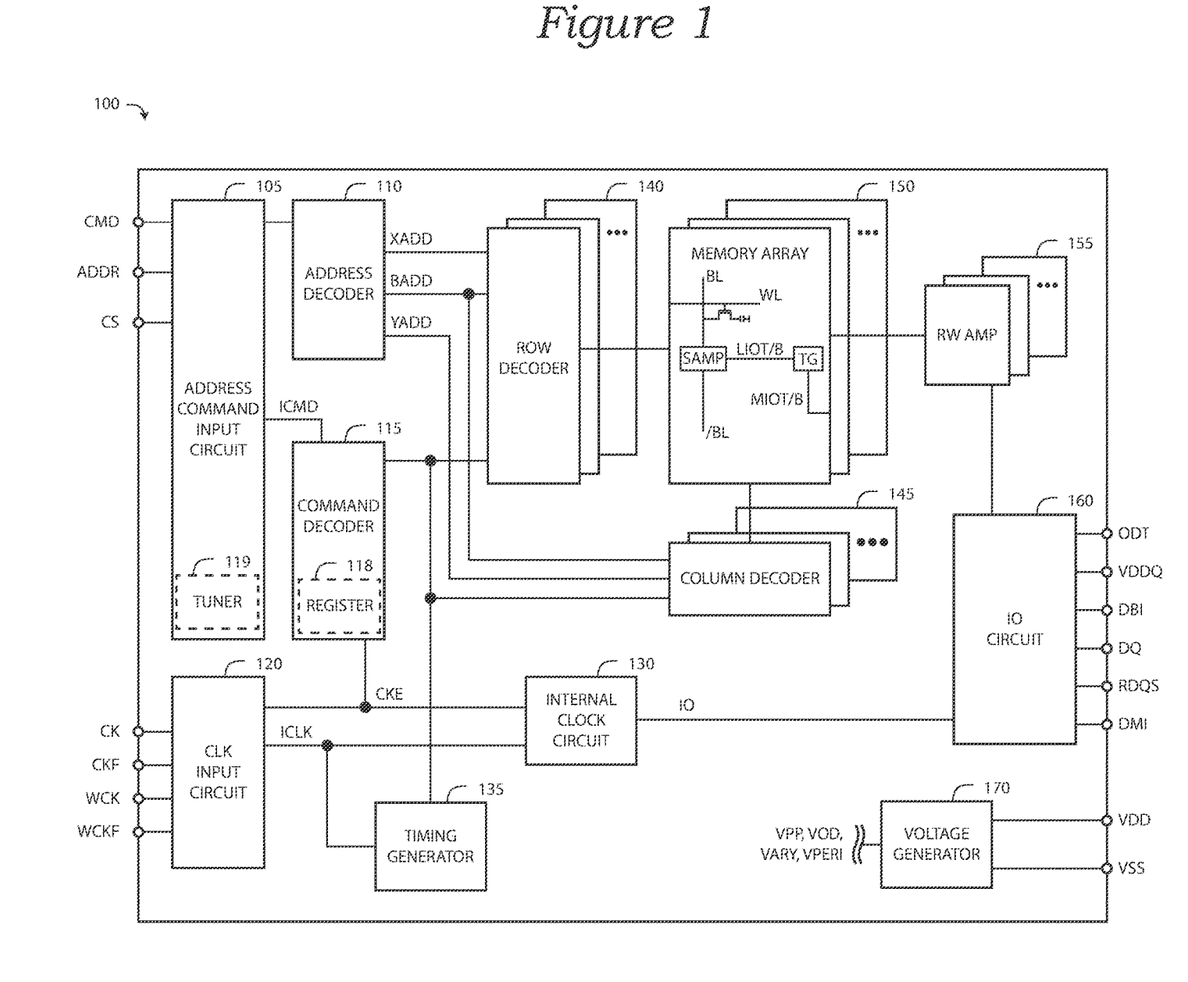
FIG. 1 is a simplified block diagram schematically illustrating a memory device in accordance with an embodiment of the present technology.

FIG. 1 is a block diagram schematically illustrating a memory device 100 (e.g., a DRAM) in accordance with an embodiment of the present technology. The memory device 100 may include an array of memory cells, such as memory array 150. The memory array 150 may include a plurality of banks (e.g., banks 0-15 in the example of FIG. 1), and each bank may include a plurality of word lines (WL), a plurality of bit lines (BL), and a plurality of memory cells arranged at intersections of the word lines and the bit lines. The selection of a word line WL may be performed by a row decoder 140, and the selection of a bit line BL may be performed by a column decoder 145. Sense amplifiers (SAMP) may be provided for corresponding bit lines BL and connected to at least one respective local I/O line pair (LIOT/B), which may in turn be coupled to at least respective one main I/O line pair (MIOT/B), via transfer gates (TG), which can function as switches.

The memory device 100 may employ a plurality of external terminals that include command and address terminals coupled to a command bus and an address bus to receive command signals CMD and address signals ADDR, respectively. The memory device may further include a chip select terminal to receive a chip select signal CS, clock terminals to receive clock signals CK and CKF, data clock terminals to receive data clock signals WCK and WCKF, data terminals DQ, RDQS, DBI, and DMI, power supply terminals VDD, VSS, VDDQ, and VSSQ, and on-die termination terminal(s) ODT.

The command terminals and address terminals may be supplied with an address signal and a bank address signal from outside. The address signal and the bank address signal supplied to the address terminals can be transferred, via a command/address input circuit 105, to an address decoder 110. The address decoder 110 can receive the address signals and supply a decoded row address signal (XADD) to the row decoder 140, and a decoded column address signal (YADD) to the column decoder 145. The address decoder 110 can also receive the bank address signal (BADD) and supply the bank address signal to both the row decoder 140 and the column decoder 145.

The command and address terminals may be supplied with command signals CMD, address signals ADDR, and chip selection signals CS, from a memory controller. The command signals may represent various memory commands from the memory controller (e.g., including access commands, which can include read commands and write commands). The select signal CS may be used to select the memory device 100 to respond to commands and addresses provided to the command and address terminals. When an active CS signal is provided to the memory device 100, the commands and addresses can be decoded and memory operations can be performed. The command signals CMD may be provided as internal command signals ICMD to a command decoder 115 via the command/address input circuit 105. The command decoder 115 may include circuits to decode the internal command signals ICMD to generate various internal signals and commands for performing memory operations, for example, a row command signal to select a word line and a column command signal to select a bit line. The internal command signals can also include output and input activation commands, such as clocked command CMDCK.

As set forth in greater detail below, the command/address input circuit 105 can include a tuner circuit 119, for the memory device-specific tuning of a received select signal CS, a received command signal CMD, and/or a received address signal ADDR (e.g., by adjusting a timing or an amplitude thereof). The tuner circuit 119 can include one or more phase shifters, delay circuits, and/or equalizers for tuning an incoming signal (e.g., a select signal, a command signal, an address signal, some combination thereof, and/or the like). The tuning circuit 119 can further include circuitry for storing one or more configuration settings (e.g., phase shifts, delay amounts, frequency response curves, amplification levels, etc.) to be applied to the one or more incoming signals.

When a read command is issued and a row address and a column address are timely supplied with the read command, read data can be read from memory cells in the memory array 150 designated by these row address and column address. The read command may be received by the command decoder 115, which can provide internal commands to input/output circuit 160 so that read data can be output from the data terminals DQ, RDQS, DBI, and DMI via read/write amplifiers 155 and the input/output circuit 160 according to the RDQS clock signals. The read data may be provided at a time defined by read latency information RL that can be programmed in the memory device 100, for example, in a mode register (not shown in FIG. 1). The read latency information RL can be defined in terms of clock cycles of the CK clock signal. For example, the read latency information RL can be a number of clock cycles of the CK signal after the read command is received by the memory device 100 when the associated read data is provided.

When a write command is issued and a row address and a column address are timely supplied with the command, write data can be supplied to the data terminals DQ, DBI, and DMI according to the WCK and WCKF clock signals. The write command may be received by the command decoder 115, which can provide internal commands to the input/output circuit 160 so that the write data can be received by data receivers in the input/output circuit 160, and supplied via the input/output circuit 160 and the read/write amplifiers 155 to the memory array 150. The write data may be written in the memory cell designated by the row address and the column address. The write data may be provided to the data terminals at a time that is defined by write latency WL information. The write latency WL information can be programmed in the memory device 100, for example, in the mode register (not shown in FIG. 1). The write latency WL information can be defined in terms of clock cycles of the CK clock signal. For example, the write latency information WL can be a number of clock cycles of the CK signal after the write command is received by the memory device 100 when the associated write data is received.

The power supply terminals may be supplied with power supply potentials VDD and VSS. These power supply potentials VDD and VSS can be supplied to an internal voltage generator circuit 170. The internal voltage generator circuit 170 can generate various internal potentials VPP, VOD, VARY, VPERI, and the like based on the power supply potentials VDD and VSS. The internal potential VPP can be used in the row decoder 140, the internal potentials VOD and VARY can be used in the sense amplifiers included in the memory array 150, and the internal potential VPERI can be used in many other circuit blocks.

The power supply terminal may also be supplied with power supply potential VDDQ. The power supply potential VDDQ can be supplied to the input/output circuit 160 together with the power supply potential VSS. The power supply potential VDDQ can be the same potential as the power supply potential VDD in an embodiment of the present technology. The power supply potential VDDQ can be a different potential from the power supply potential VDD in another embodiment of the present technology. However, the dedicated power supply potential VDDQ can be used for the input/output circuit 160 so that power supply noise generated by the input/output circuit 160 does not propagate to the other circuit blocks.

The on-die termination terminal(s) may be supplied with an on-die termination signal ODT. The on-die termination signal ODT can be supplied to the input/output circuit 160 to instruct the memory device 100 to enter an on-die termination mode (e.g., to provide one of a predetermined number of impedance levels at one or more of the other terminals of the memory device 100).

The clock terminals and data clock terminals may be supplied with external clock signals and complementary external clock signals. The external clock signals CK, CKF, WCK, WCKF can be supplied to a clock input circuit 120. The CK and CKF signals can be complementary, and the WCK and WCKF signals can also be complementary. Complementary clock signals can have opposite clock levels and transition between the opposite clock levels at the same time. For example, when a clock signal is at a low clock level a complementary clock signal is at a high level, and when the clock signal is at a high clock level the complementary clock signal is at a low clock level. Moreover, when the clock signal transitions from the low clock level to the high clock level the complementary clock signal transitions from the high clock level to the low clock level, and when the clock signal transitions from the high clock level to the low clock level the complementary clock signal transitions from the low clock level to the high clock level.

Input buffers included in the clock input circuit 120 can receive the external clock signals. For example, when enabled by a CKE signal from the command decoder 115, an input buffer can receive the CK and CKF signals and the WCK and WCKF signals. The clock input circuit 120 can receive the external clock signals to generate internal clock signals ICLK. The internal clock signals ICLK can be supplied to an internal clock circuit 130. The internal clock circuit 130 can provide various phase and frequency controlled internal clock signal based on the received internal clock signals ICLK and a clock enable signal CKE from the command/address input circuit 105. For example, the internal clock circuit 130 can include a clock path (not shown in FIG. 1) that receives the internal clock signal ICLK and provides various clock signals to the command decoder 115. The internal clock circuit 130 can further provide input/output (IO) clock signals. The IO clock signals can be supplied to the input/output circuit 160 and can be used as a timing signal for determining an output timing of read data and the input timing of write data. The IO clock signals can be provided at multiple clock frequencies so that data can be output from and input to the memory device 100 at different data rates. A higher clock frequency may be desirable when high memory speed is desired. A lower clock frequency may be desirable when lower power consumption is desired. The internal clock signals ICLK can also be supplied to a timing generator 135 and thus various internal clock signals can be generated.

The memory device 100 may further include one or more registers 118 for storing various data (e.g., device status information). Mode registers 118 may include read-only bits, read-write bits, write-only bits, or any combination thereof. In some embodiments, mode registers 118 may be arranged in byte-sized addressable portions, with each individually-addressable mode register containing 8 bits. The mode register bits may be written in response to mode register write (MRW) commands in which the data to be written is provided over the CA interface, and the mode register bits may be read from in response to mode register read (MRR) commands in which the stored data output through the DQ data terminals. The mode registers 118 may also be read and written internally by various components of the memory device 100 (e.g., populating read-only mode register bits with device status or configuration information, determining a status of a write-only mode register bit, etc.), but without exchanging data with a terminal of the memory device.

Figure 2:
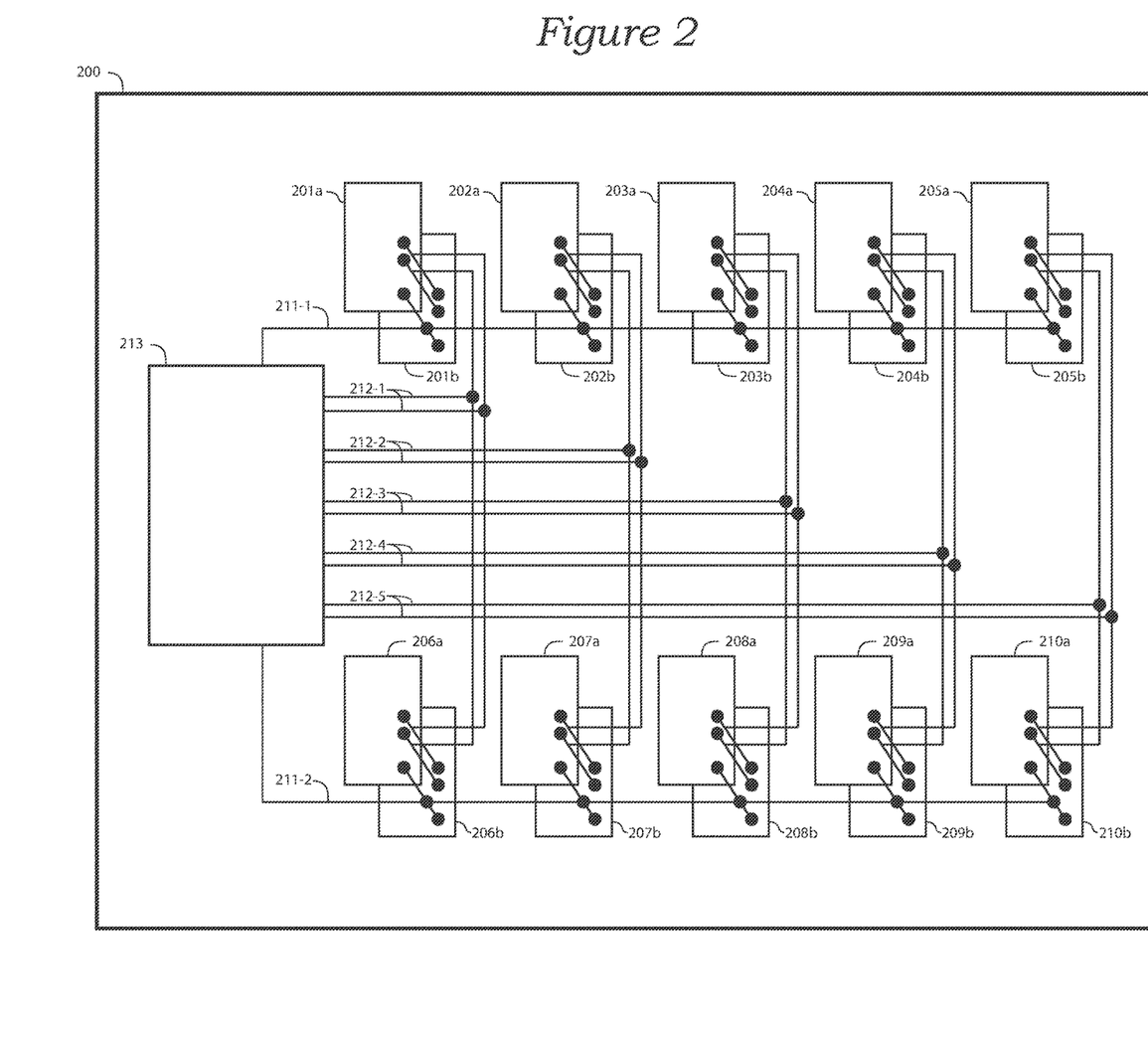
FIG. 2 is a simplified block diagram schematically illustrating a portion of a memory module in accordance with an embodiment of the present technology.

FIG. 2 is a simplified block diagram schematically illustrating a portion of a memory module in accordance with an embodiment of the present technology. Memory module 200 can include any number of memory devices (e.g., such as the memory device 100 illustrated in FIG. 1), with twenty memory devices 201a, 201b, 202a, 202b, 203a, 203b, 204a, 204b, 205a, 205b, 206a, 206b, 207a, 207b, 208a, 208b, 209a, 209b, 210a, and 210b shown in FIG. 2 as an example for the purpose of illustration. Memory module 200 can also include a registering clock driver (RCD) 213 for receiving clock and command/address signals from an edge connector (not illustrated) of the memory module 100 and for re-driving/distributing the signals to the memory devices 201a-210b over one or more clock trees and one or more command/address buses. The memory module 200 can also include data connections (not illustrated) directly between the memory devices and the edge connector, for exchanging data with the connected host device.

The memory module 200 includes two command/address buses 211-1 and 211-2 and five differential clock trees 212-1, 212-2, 212-3, 212-4, and 212-5. In the illustrated example, the memory devices are DRAMs that are arranged in two rows on each side of the memory module 200 (e.g., a dual in-line memory module (DIMM)), with a first row on the front side including memory devices 201a, 202a, 203a, 204a, and 205a, and a second row on the front side including memory devices 206a, 207a, 208a, 209a, and 210a. A first row on the back side includes memory devices 201b, 202b, 203b, 204b, and 205b, and a second row on the back side includes v devices 206b, 207b, 208b, 209b, and 210b.

The memory devices in the first row of both the front and the back side (201a, 201b, 202a, 202b, 203a, 203b, 204a, 204b, 205a, and 205b) are connected to command/address bus 211-1 to receive command/address signals CA1. The memory devices in the second row of both the front and the back side (206a, 206b, 207a, 207b, 208a, 208b, 209a, 209b, 210a, and 210b) are connected to command/address bus 211-2 to receive command/address signals CA2.

The five clock trees 212-1, 212-2, 212-3, 212-4, and 212-5 are provided to transmit multiple distributed clock signals to each memory device of the multiple memory devices. In the illustrated example, memory devices 201a, 201b, 206a, and 206b are directly connected to differential clock tree 212-1 to receive a first differential clock signal. Memory devices 202a, 202b, 207a, and 207b are directly connected to differential clock tree 212-2 to receive a second differential clock signal. Memory devices 203a, 203b, 208a, and 208b are directly connected to differential clock tree 212-3 to receive a third differential clock signal. Memory devices 204a, 204b, 209a, and 209b are directly connected to differential clock tree 212-4 to receive a fourth differential clock signal. Memory devices 205a, 205b, 210a, and 210b are directly connected to differential clock tree 212-5 to receive a fifth differential clock signal. In accordance with one aspect of the present disclosure, being "directly connected" means being connected without coupling to another memory device at an intermediate point along the command/address bus 211-1 (e.g., not in a serial or "daisy-chain" arrangement).

Because each memory device 201a-210b is in a different physical and topological position with respect to the corresponding clock tree and command/address bus, the propagation delay of clock and command/address signals received at each memory device from the RCD 213 can vary. In conventional approaches, this challenge would be addressed by optimizing the layout of the traces for the clock trees and the command/address buses (e.g., by selecting the length, resistance, impedance, and other aspects of the traces thereof to mitigate the different delays in the propagation of signals). As set forth above, however such an approach can still be negatively impacted by variation in device performance, manufacturing tolerances and other factors, which may still cause clock skewing to remain.

In accordance with one aspect of the present disclosure, the RCD 213 can perform clock training for each of the five clock trees 212-1, 212-2, 212-3, 212-4, and 212-5. For example, all but one of the clock trees can be disabled, leaving only a single clock tree to be enabled, and an adjustment can be made to the timing of the signals leaving the RCD 213 on the enabled clock tree to ensure a temporal alignment between command/address signals that are clocked into the memory devices connected to the enabled clock tree during their intended states. For example, clock tree 212-1 can be left enabled while clock trees 212-2, 212-3, 212-4 and 212-5 are disabled, and a timing adjustment (e.g., a delay or an advancement) of the clock signals distributed on clock tree 212-1 can be made to optimize a composite (e.g., average) timing margin (or other performance characteristic) for memory devices 201a, 201b, 206a, and 206b connected thereto. A similar process can be performed for each of the other clock trees in turn, such that all of the memory devices are provided with a "coarse" (e.g., specific to each clock tree) clock timing adjustment.

Figure 3:
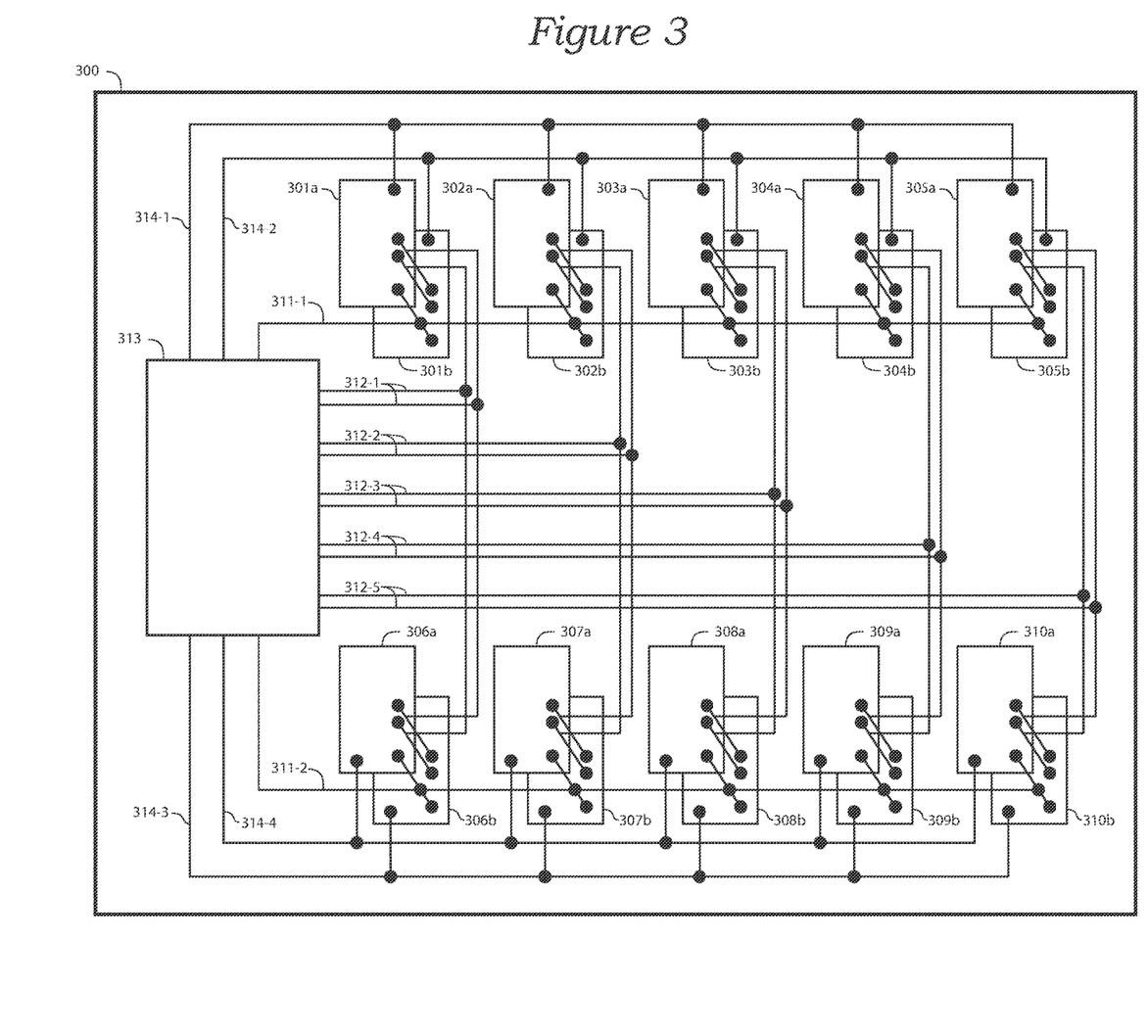
FIG. 3 is a simplified block diagram schematically illustrating a portion of a memory module in accordance with an embodiment of the present technology.

In accordance with yet another aspect of the subject disclosure, a memory module can be configured with a per-memory-device clock optimization by isolating not only a single clock tree, but a single memory device connected to a clock tree. FIG. 3 is a simplified block diagram schematically illustrating a portion of such a memory module in accordance with an embodiment of the present technology. As can be seen with reference to FIG. 3, memory module 300 is identical or substantially similar to memory module 200 except for the addition of control lines 314-1, 314-2, 314-3, and 314-4 configured to distribute control signals (e.g., chip select signals) to each of the memory devices 301a-310b in parallel. By providing as many control lines as there are memory devices connected to each of the clock trees 312-1, 312-2, 312-3, 312-4, and 312-5, a single memory device can be isolated for a tuning operation by disabling all but one of the clock trees 312-1, 312-2, 312-3, 312-4, and 312-5 and all but one of the control lines 314-1, 314-2, 314-3, and 314-4. For example, memory device 301*a* can be isolated by leaving clock tree 312-1 enabled and disabling every other clock tree 312-2, 312-3, 312-4, and 312-5, and leaving control line 314-1 enabled and disabling every other control line 314-2, 314-3, and 314-4. Once memory device 301*a* is thus isolated, a "fine" tuning operation (e.g., a tuning specific to the memory device, rather than to the clock tree to which multiple memory devices are attached) can be performed for adjusting a clock skew particular to memory device 301*a*.

In this regard, memory device 301*a* can include circuitry (e.g., tuning circuit 119, illustrated above with reference to FIG. 1) configured to provide an adjustment to an incoming signal, such as a command/address signal, a chip select signal, or the like. The adjusted signal can be shifted in time to optimize a clock skew (e.g., minimizing skew by phase shifting, delaying or advancing a received command/address signal, a received chip select or other control signal, and/or the clock signal received from the clock tree internal to the memory). Alternatively or additionally, the adjusted signal can be equalized (e.g., by attenuation or amplification) to address a non-uniform or lossy channel (e.g., a signal path in which the signal is degraded by attenuation across some or all of the frequencies thereof) between the RCD 313 and the memory device 301*a*.

Although in the foregoing example a memory device has been illustrated and described as performing an equalization operation at the memory device (e.g., with a tuning circuit including one or more amplifiers or attenuators), in another embodiment the RCD 313 can include one or more equalizers in place of or in addition to the equalizers in the memory devices. By providing equalizers in the RCD 313, an equalization profile (e.g., for each memory device, or for groups of memory devices sharing a control line or a command/address bus) can be utilized to modify the signals distributed from the RCD 313 to accommodate a non-ideal communication channel between the RCD 313 and each memory device (or each group of memory devices).

Further, although in the foregoing example a memory device has been illustrated and described as performing an clock skew optimization operation at the memory device (e.g., with a tuning circuit including one or more phase shifters or delay lines), in another embodiment the RCD 313 can include one or more phase shifters or delay lines in place of or in addition to the phase shifters or delay lines in the memory devices. By providing phase shifters or delay lines in the RCD 313 (e.g., configured to delay a control signal or a command/address signal), a delay profile (e.g., for each memory device, or for groups of memory devices sharing a control line or a command/address bus) can be utilized to modify the signals distributed from the RCD 313 to improve alignment of a clock signal with a control signal and/or command/address signal between the RCD 313 and each memory device (or each group of memory devices).

Moreover, although in the foregoing example a memory device has been illustrated and described as being isolated by disabling a combination of clock trees and control lines (e.g., chip select lines), in another embodiment, a memory device can be isolated by additionally or alternatively disabling a portion of a command/address bus. In this regard, in the memory module 300 of FIG. 3, command/address busses 311-1 and 311-2 each provide connectivity between the RCD 313 and half of the illustrate memory devices. Accordingly, by disabling one of the command/address busses 311-1 and 311-2 and all but one of the clock trees 312-1, 312-2, 312-3, 312-4, and 312-5, a memory device can be isolated even if the number of control lines is not equal to the number of memory devices connected to each clock tree (e.g., if only two control lines were provided rather than the four illustrated). As one of skill in the art will readily appreciate, a memory device can be isolated for a fine tuning operation by disabling a combination of clock trees, control lines, command/address busses, and/or other traces that connect to a subset of the memory devices (e.g., mirror pins that differentiate a front from a back side of a module, address inversion lines that differentiate top rows of memory devices from bottom rows, etc.).

Characterized generally, where an RCD is operably connected to x memory devices by y clock trees and z control lines, a memory device can be isolated by disabling all but one of the one of the y clock trees and all but one of the z control lines where the product of y and z is equal to x (and there is an orthogonal relationship between the topologies of the y clock trees and the z control lines). In this regard, the z control lines may be lines devoted to different kinds of signals (e.g., chip select signals, command/address signals, address inversion signals, mirror signals, etc.) or may all be devoted to the same kind of signal.

In another aspect of the subject disclosure, groups of memory devices can be "fine" tuned at a sub-clock-tree level, even if not isolated. In this regard, for memory modules in which it may be impractical to include a sufficient number of control lines that can be used to isolate each of the memory devices coupled to a clock tree, subsets (e.g., groups of two, three, four, etc.) of the memory devices attached to the clock tree may be left enabled when all others are disabled (e.g., by disabling all but one of the control lines capable of being disabled) and tuned on a per-group basis (e.g., by optimizing the clock skew of the enabled group).

Although in the foregoing example embodiment, memory modules have been illustrated and described as being first optimized at a "coarse" level (e.g., with a clock-tree specific timing optimization performed by the RCD) and subsequently at a "fine" level (e.g., with a device-specific or a group-specific optimization performed at the memory devices), in other embodiments the "coarse" optimization can be omitted and only the device-level (or group-level) optimizations may be performed.

In addition to the forgoing signal tuning operations (e.g., clock skew optimization, equalization and/or amplification) that are configured to optimize performance on a per-memory-device level, in another aspect of the present disclosure, optimizations of groups of memory devices or even all of the memory devices can benefit from the ability to isolate one or more memory devices for other optimizations. For example, per-memory-device optimization of on die termination levels (e.g., for one or more termination modes) can benefit from discrete communications between an RCD and each memory device (or subset of memory devices) in turn. In this regard, a feedback signal line that can convey information from the memory devices on a memory module to an RCD thereof may be utilized to provide information on the memory device optimization to the RCD, either while the memory device is isolated or following the enablement of previously-disabled clock trees and/or control lines. One such memory module including a feedback signal line is illustrated in FIG. 4, in accordance with one aspect of the present disclosure.

Figure 4:
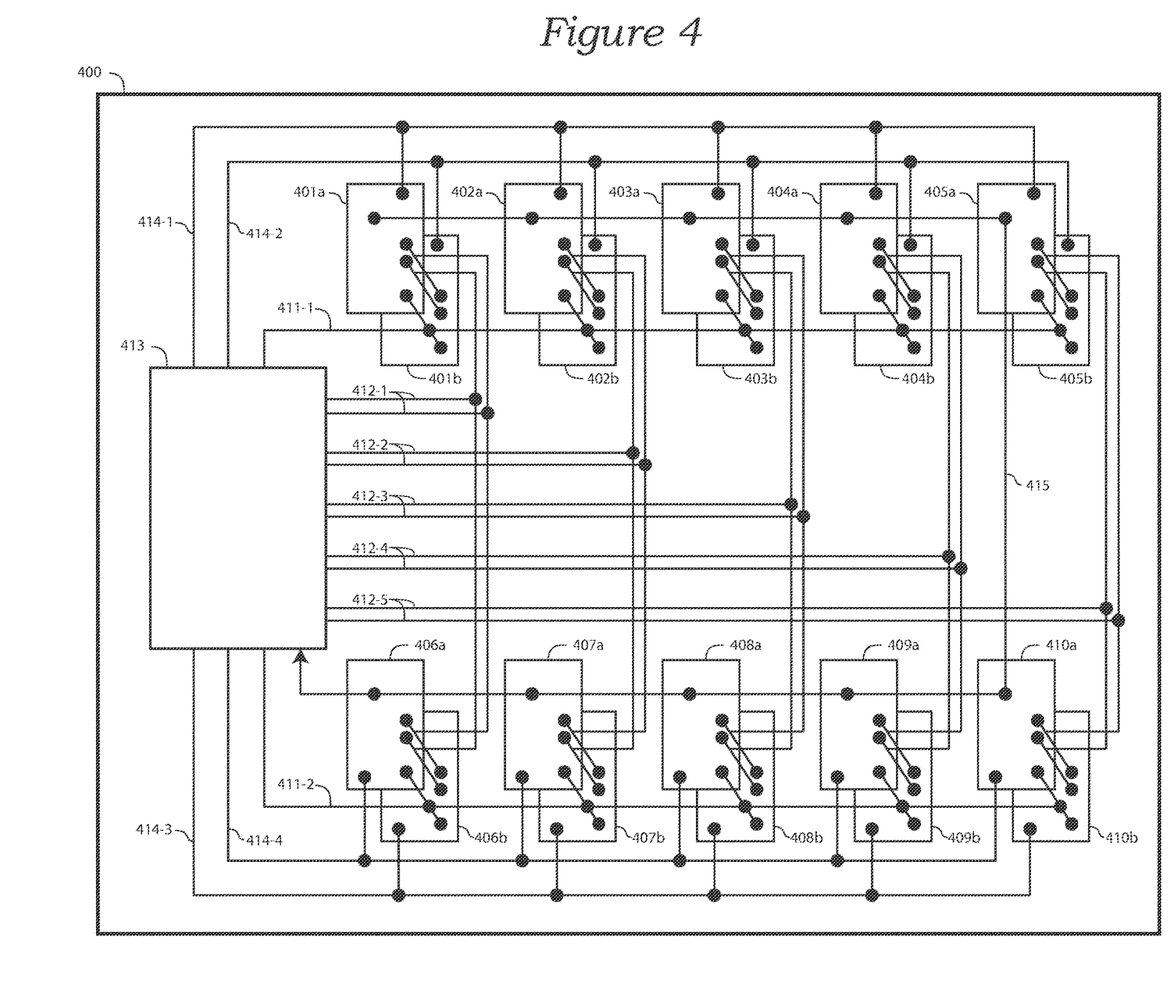
FIG. 4 is a simplified block diagram schematically illustrating a portion of a memory module in accordance with an embodiment of the present technology.

As can be seen with reference to the simplified block diagram of FIG. 4, memory module 400 is identical or substantially similar to memory module 300 except for the addition of feedback signal line 415, which is configured to carry an alert or other feedback signal from one or more of the memory devices 401a-410b to the RCD 413. The feedback signal line 415 is illustrated as connected to each of the memory devices 401a-410b in a serial or daisy-chain fashion (n.b., connections between the feedback signal line and memory devices on the back side of the memory module are obscured by the perspective view of the Figure).

In operation, the RCD 413 can isolate a single memory device by disabling all but one of the clock trees 412-1, 412-2, 412-3, 412-4, and 412-5 and all but one of the control lines 414-1, 414-2, 414-3, and 414-4. For example, memory device 401a can be isolated by leaving clock tree 412-1 enabled and disabling every other clock tree 412-2, 412-3, 412-4, and 412-5, and leaving control line 414-1 enabled and disabling every other control line 414-2, 414-3, and 414-4. Once memory device 401a is thus isolated, an operation to adjust a termination level (e.g., an impedance "seen" by one or more of the command/address bus 411-1, the control line 414-1, and the clock tree 412-1, etc.) can be performed without interference from or undesired response from the other disabled memory devices.

In accordance with one aspect of the present disclosure, device termination may be more accurately optimized when other memory devices connected to the same control line or command/address bus are operating. Accordingly, during the isolation of a memory device, the RCD 413 can be configured to provide the isolated and enabled memory device with a dynamic ID that the memory device can be configured to store (e.g., in a mode register thereof like mode register 418 illustrated in FIG. 1). The memory device can be further configured to monitor incoming communications (e.g., when the memory device is no longer isolated by disabling command/address buses, clock trees and/or signal lines) for the dynamic ID and respond to commands including the dynamic ID. In this regard, by assigning each memory device a different dynamic ID, and by using the dynamic ID to separately command a change in the termination of each of the memory devices, an operating or communicating memory device can utilize the feedback signal line 415 to signal when a changed termination of another one or more of the memory devices has reached a predetermined level or performance characteristic. In this way, the termination of each memory device can be optimized based on the performance characteristic of other memory devices by the RCD 413.

Figure 5:
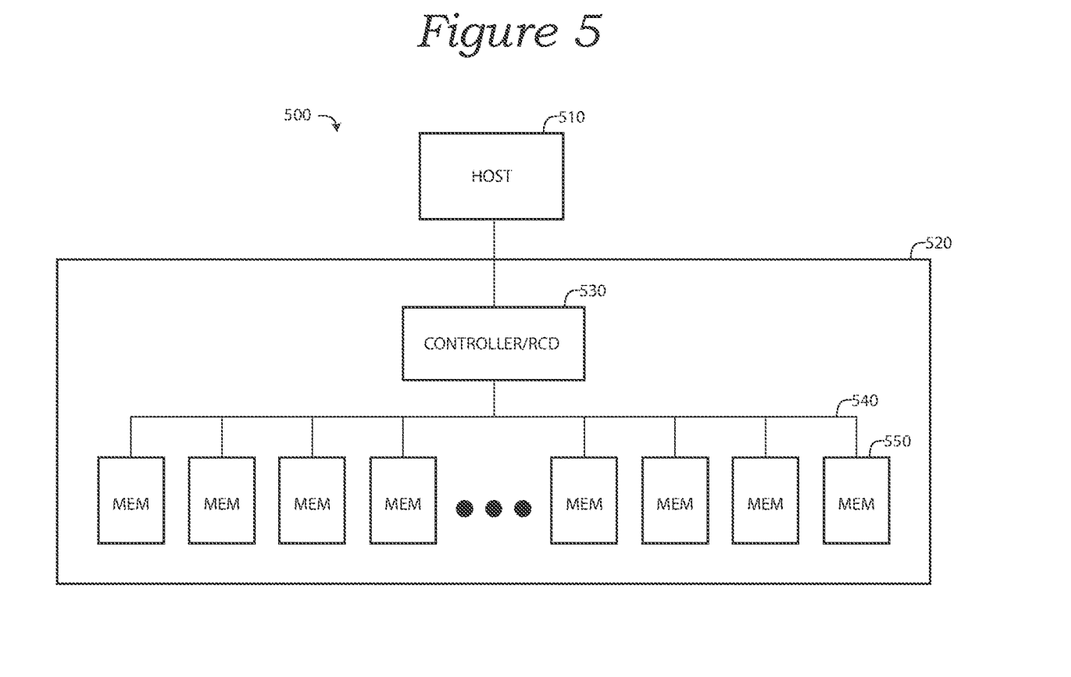
FIG. 5 is a simplified block diagram schematically illustrating a memory system in accordance with an embodiment of the present technology.

FIG. 5 is a simplified block diagram schematically illustrating a memory system 500 in accordance with an embodiment of the present technology. Memory system 500 includes a host device 510 operably coupled to a memory module 520 (e.g., a dual in-line memory module (DIMM)). Memory module 520 can include a controller or an RCD 530 operably connected by one or more control lines and/or buses (such as bus 540, which although schematically illustrated as a single parallel bus, may comprise a variety of separate clock trees, command/address buses, and control lines, as set forth in greater detail above) to a plurality of memory devices 550. In accordance with one aspect of the present disclosure, the RCD can be configured to perform a "coarse" clock skew optimization for each clock tree connected thereto, as set forth above in greater detail. In accordance with another aspect of the present disclosure, memory devices 550 can each be configured to perform a tuning operation when isolated (e.g., either alone or in a subset of the memory devices), as set forth above in greater detail.

Although in the foregoing example embodiments, memory modules and devices have been illustrated and described with respect to DRAM devices, embodiments of the present technology may have application to other memory technologies, including SRAM, SDRAM, NAND and/or NOR flash, phase change memory (PCM), magnetic RAM (MRAM), ferroelectric RAM (FeRAM), etc. Moreover, although memory modules have been illustrated and described as dual in-line memory modules (DIMMs) having a particular number of memory devices, embodiments of the disclosure may include more or fewer memory devices, and/or involve other memory module or package formats (e.g., single in-line memory modules (SIMMs), small outline DIMMS (SODIMMs), single in-line pin packages (SIPPs), custom memory packages, etc.). Moreover, although DIMMs have been described and illustrated with a single dedicated RCD dies, in other embodiments multiple RCD dies (and/or other integrated circuit dies, such as memory controllers, processors, etc.) may or may not be included in the memory modules to provide the functions described above (e.g., selectably disabling clock trees, command/address buses, and/or control lines to isolate clock trees and/or memory modules to optimize clock skew, equalize signals, configure terminations, etc.).

Figure 6:
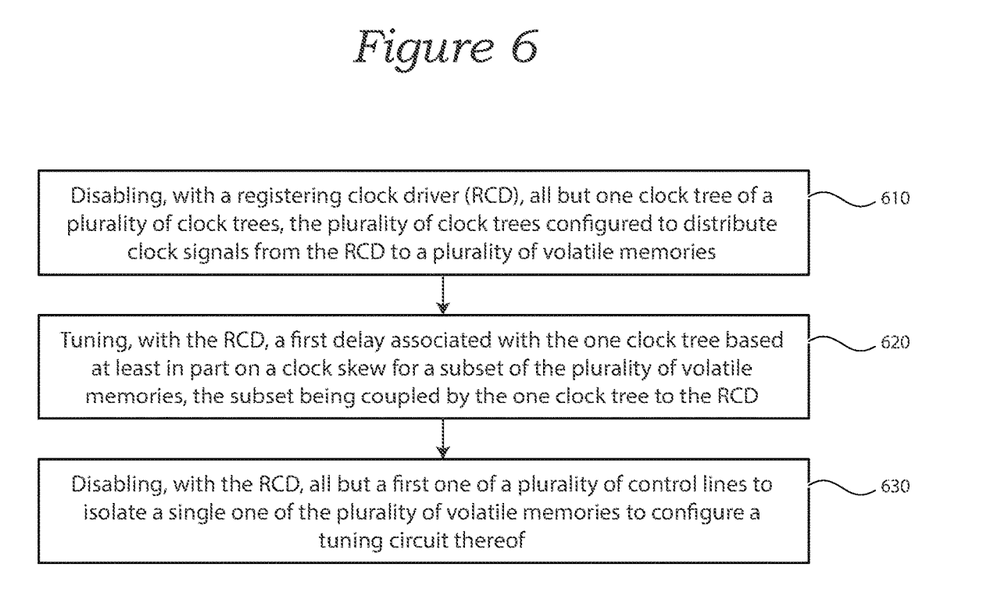
FIG. 6 is a flow chart illustrating a method of operating a memory system in accordance with an embodiment of the present technology.

FIG. 6 is a flow chart illustrating a method of operating a memory system in accordance with an embodiment of the present technology. The method includes disabling, with a registering clock driver (RCD), all but one clock tree of a plurality of clock trees, the plurality of clock trees configured to distribute clock signals from the RCD to a plurality of volatile memories (box 610). According to one aspect of the present disclosure, the disabling features of box 610 may be implemented with RCD 313 as illustrated in FIG. 3 in greater detail, above. The method further includes tuning, with the RCD, a first delay associated with the one clock tree based at least in part on a clock skew for a subset of the plurality of volatile memories, the subset being coupled by the one clock tree to the RCD (box 620). According to one aspect of the present disclosure, the tuning features of box 620 may be implemented with RCD 313 as illustrated in FIG. 3 in greater detail, above. The method further includes disabling, with the RCD, all but a first one of a plurality of control lines to isolate a single one of the plurality of volatile memories to configure a tuning circuit thereof (box 630). According to one aspect of the present disclosure, the disabling features of box 630 may be implemented with RCD 313 as illustrated in FIG. 3 in greater detail, above.

It should be noted that the methods described above describe possible implementations, and that the operations and the steps may be rearranged or otherwise modified and that other implementations are possible. Furthermore, embodiments from two or more of the methods may be combined.

Although in the foregoing example embodiments, memory modules and devices have been illustrated and described with respect to DRAM devices, embodiments of the present technology may have application to other memory technologies, including SRAM, SDRAM, NAND and/or NOR flash, phase change memory (PCM), magnetic RAM (MRAM), ferroelectric RAM (FeRAM), etc. Moreover, although memory modules have been illustrated and described as dual in-line memory modules (DIMMs) having nine memory devices, embodiments of the disclosure may include more or fewer memory devices, and/or involve other memory module or package formats (e.g., single in-line memory modules (SIMMs), small outline DIMMS (SODIMMs), single in-line pin packages (SIPPs), custom memory packages, etc.).

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal; however, it will be understood by a person of ordinary skill in the art that the signal may represent a bus of signals, where the bus may have a variety of bit widths.

The devices discussed herein, including a memory device, may be formed on a semiconductor substrate or die, such as silicon, germanium, silicon-germanium alloy, gallium arsenide, gallium nitride, etc. In some cases, the substrate is a semiconductor wafer. In other cases, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

The functions described herein may be implemented in hardware, software executed by a processor, firmware, or any combination thereof. Other examples and implementations are within the scope of the disclosure and appended claims. Features implementing functions may also be physically located at various positions, including being distributed such that portions of functions are implemented at different physical locations.

As used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

From the foregoing, it will be appreciated that specific embodiments of the invention have been described herein for purposes of illustration, but that various modifications may be made without deviating from the scope of the invention. Rather, in the foregoing description, numerous specific details are discussed to provide a thorough and enabling description for embodiments of the present technology. One skilled in the relevant art, however, will recognize that the disclosure can be practiced without one or more of the specific details. In other instances, well-known structures or operations often associated with memory systems and devices are not shown, or are not described in detail, to avoid obscuring other aspects of the technology. In general, it should be understood that various other devices, systems, and methods in addition to those specific embodiments disclosed herein may be within the scope of the present technology.

We claim:

1. A memory module, comprising:
   a registering clock driver (RCD);
   x volatile memories; and
   y clock trees operably coupling the RCD to the x volatile memories,
   wherein the RCD is configured to selectively disable all but a first one of the y clock trees to isolate a first corresponding subset of x/y of the x volatile memories to tune a first delay associated with the first one of the y clock trees, and
   wherein each of x, y, and x/y is a positive integer greater than 1.

2. The memory module of claim 1, wherein the first delay is stored in the RCD and applied to the first clock tree during operation of the memory module.

3. The memory module of claim 1, wherein tuning the first delay includes optimizing a first clock skew associated with the first one of the y clock trees.

4. The memory module of claim 3, wherein the first clock skew is associated with one of a command/address bus or a chip select control line.

5. The memory module of claim 1, wherein tuning the first delay includes optimizing a first clock skew of a command/address signal associated with the first one of the y clock trees.

6. The memory module of claim 1, wherein the RCD is further configured to selectively disable all but a second one of the y clock trees to isolate a second corresponding subset of the x volatile memories the second corresponding subset including x/y of the x volatile memories, to tune a second delay associated with the second one of they clock trees.

7. The memory module of claim 1, wherein each of the y clock trees is coupled to x/y of the x volatile memories in parallel.

8. The memory module of claim 1, further comprising at least one command/address bus coupling the RCD to the x volatile memories.

9. The memory module of claim 1, wherein each of the x volatile memories is a dynamic random access memory (DRAM).

10. The memory module of claim 1, wherein the memory module is a dual in-line memory module (DIMM).

11. A memory module, comprising:
    a registering clock driver (RCD);
    x volatile memories, each including a tuning circuit;
    y clock trees configured to distribute clock signals from the RCD to the x volatile memories; and
    z control lines configured to distribute control signals from the RCD to the x volatile memories,
    wherein each of x, y, and z, is a positive integer greater than 1, and
    wherein the RCD is configured to selectively disable all but one of the y clock trees and all but one of the z control lines to isolate a single one of the x volatile memories to configure the tuning circuit thereof.

12. The memory module of claim 11, wherein each of the y clock trees is configured to operably connect the RCD to a first corresponding subset of the x volatile memories, wherein the first corresponding subset includes x/y of the x volatile memories, and wherein x/y is a positive integer greater than 1.

13. The memory module of claim 11, wherein each of the z control lines is configured to operably connect the RCD to a second corresponding subset of the x volatile memories, wherein the second corresponding subset includes x/z of the x volatile memories, and wherein x/z is a positive integer greater than 1.

14. The memory module of claim 11, wherein each of the y clock trees is coupled to x/y of the x volatile memories in parallel.

15. The memory module of claim 11, wherein each of the z control lines is coupled to x/z of the x volatile memories in parallel.

16. The memory module of claim 11, further comprising at least one command/address bus coupling the RCD to the x volatile memories.

17. The memory module of claim 11, wherein the tuning circuit of each of the x volatile memories comprises phase shifting circuitry configured to tune a timing of a received signal.

18. The memory module of claim 17, wherein the received signal is one of a command/address signal or a chip select signal.

19. The memory module of claim 11, wherein the tuning circuit of each of the x volatile memories comprises equalizing circuitry configured to tune one or more amplitudes of a received signal.

20. The memory module of claim 19, wherein the received signal is one of a command/address signal or a chip select signal.

21. The memory module of claim 11, wherein the tuning circuit of each of the x volatile memories comprises impedance adjustment circuitry configured to tune a termination of the corresponding volatile memory.

22. The memory module of claim 11, wherein the tuning circuit of each of the x volatile memories comprises storage circuitry to store a tuning configuration specific to the corresponding volatile memory.

23. The memory module of claim 22, wherein the tuning configuration comprises one or more phase delays, one or more amplitude adjustments, one or more termination impedances, or a combination thereof.

24. The memory module of claim 11, wherein the z control lines are configured to distribute chip select signals, command/address signals, address inversion signals, mirror signals, or a combination thereof.

25. The memory module of claim 11, further comprising a feedback signal line operably coupling the x volatile memories to the RCD, and configured to carry an alert signal from at least one of the x volatile memories to the RCD.

26. The memory module of claim 25, wherein the RCD is configured to monitor the feedback signal line for the alert signal during configuration of the tuning circuit of each of the x volatile memories.

27. The memory module of claim 11, wherein the tuning circuit of each of the x volatile memories comprises circuitry configured to store a dynamic ID assigned by the RCD to the corresponding volatile memory during a configuration of the tuning circuit.

28. The memory module of claim 27, wherein the tuning circuit of each of the x volatile memories comprises circuitry configured to monitor a signal received at the corresponding volatile memory for the assigned dynamic ID.

29. The memory module of claim 28, wherein each of the x volatile memories is configured, in response to the tuning circuit thereof detecting the assigned dynamic ID in the monitored signal, to enable or disable an alert signal for communication to the RCD over a feedback signal line of the memory module.

30. The memory module of claim 11, wherein each of the x volatile memories is a dynamic random access memory (DRAM).

31. A volatile memory integrated circuit device, comprising:
a volatile memory array;
a command/address input circuit configured to receive command/address input signals;
a clock input circuit configured to receive clock signals; and
a tuning circuit configured to adjust a timing and/or an amplitude of the received command/address input signals,
wherein the tuning circuit is further configured to adjust a timing and/or an amplitude of a received chip select signal, and
wherein the tuning circuit is configured to store a dynamic ID assigned to the volatile memory integrated circuit device during a configuration of the tuning circuit.

32. The volatile memory integrated circuit device of claim 31, wherein the tuning circuit comprises one or more phase delay elements, one or more equalizers, or a combination thereof.

33. The volatile memory integrated circuit device of claim 31, wherein the tuning circuit is further configured to adjust an impedance of the volatile memory integrated circuit device.

34. The volatile memory integrated circuit device of claim 31, wherein the tuning circuit is configured to store a tuning configuration corresponding to a measured clock skew or a measured frequency response at the command/address input circuit.

35. The volatile memory integrated circuit device of claim 31, wherein the tuning circuit is configured to monitor a signal received by the volatile memory integrated circuit device for the assigned dynamic ID.

36. The volatile memory integrated circuit device of claim 35, wherein the volatile memory integrated circuit device is configured, in response to the tuning circuit detecting the assigned dynamic ID in the monitored signal, to enable or disable an alert signal for communication over a feedback signal line connected to the volatile memory integrated circuit device.

37. The volatile memory integrated circuit device of claim 31, wherein the volatile memory array is a DRAM array.

38. A method, comprising:
disabling, with a registering clock driver (RCD), all but one clock tree of a plurality of clock trees, the plurality of clock trees configured to distribute clock signals from the RCD to a plurality of volatile memories; and
tuning, with the RCD, a first delay associated with the one clock tree based at least in part on a clock skew for a subset of the plurality of volatile memories, the subset being coupled by the one clock tree to the RCD.

39. The method of claim 38, wherein each of the plurality of clock trees is configured to operably connect the RCD to a corresponding subset of a plurality of subsets of the plurality of volatile memories.

40. The method of claim 38, further comprising storing the first delay in the RCD.

41. The method of claim 38, further comprising further disabling, with the RCD, all but a first one of a plurality of control lines to isolate a single one of the plurality of volatile memories to configure a tuning circuit thereof.

42. The method of claim 41, wherein each of the plurality of control lines is configured to operably connect the RCD to a corresponding subset of the plurality of volatile memories.

43. The method of claim 41, wherein configuring the tuning circuit of the single one of the plurality of volatile memories comprises adjusting phase shifting circuitry configured to tune a timing of a received signal.

44. The method of claim 41, wherein configuring the tuning circuit of the single one of the plurality of volatile memories comprises adjusting equalizing circuitry configured to tune one or more amplitudes of a received signal.

45. The method of claim 41, wherein configuring the tuning circuit of the single one of the plurality of volatile memories comprises adjusting impedance adjustment circuitry configured to tune a termination level.

* * * * *